(12) United States Patent
Hirota

(10) Patent No.: US 6,822,309 B2
(45) Date of Patent: Nov. 23, 2004

(54) APPARATUS FOR SELECTIVELY CUTTING FUSE ELECTRODES

(75) Inventor: Tomoki Hirota, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/813,992

(22) Filed: Mar. 22, 2001

(65) Prior Publication Data

US 2001/0023975 A1 Sep. 27, 2001

(30) Foreign Application Priority Data

Mar. 23, 2000 (JP) ........................................ 2000-082577

(51) Int. Cl.⁷ ................................................ H01L 29/00
(52) U.S. Cl. ...................... 257/529; 257/534; 257/638; 257/665; 438/132
(58) Field of Search .................. 257/529, 534, 257/638, 665; 438/132

(56) References Cited

U.S. PATENT DOCUMENTS 5,872,390 A * 2/1999 Lee et al. ................... 257/529
5,989,783 A * 11/1999 Huggins et al. ............. 430/314
6,172,929 B1 * 1/2001 Carson et al. ............ 365/225.7

FOREIGN PATENT DOCUMENTS

| JP | 88-002407 | 12/1983 | |
| JP | 2-99285 A | 4/1990 | |
| JP | 7-273200 A | 10/1995 | |
| JP | 07273200 A | * 10/1995 | ........... H01L/21/82 |
| JP | 7-321209 A | 12/1995 | |
| KR | 1999-40261 | 11/1999 | |
| KR | 1999-85774 | 12/1999 | |
| KR | 19990085774 | * 12/1999 | ........... H01L/27/00 |
| WO | WO 00/08687 A1 | 2/2000 | |

* cited by examiner

Primary Examiner—Allan R. Wilson
Assistant Examiner—Matthew Warren
(74) Attorney, Agent, or Firm—Sughrue Mion, PLLC

(57) ABSTRACT

Adjacent ones of a plurality of fuse electrodes extending parallel to each other are cut off by a laser beam. Cutting positions on the adjacent fuse electrodes are set to positions which are different from each other in a direction in which the fuse electrodes extend. Since the cutting positions on the adjacent fuse electrodes are different from each other, the adjacent fuse electrodes are prevented from being short-circuited by fragments of components thereof that are scattered when the laser beam is applied to cut off the fuse electrodes.

3 Claims, 11 Drawing Sheets

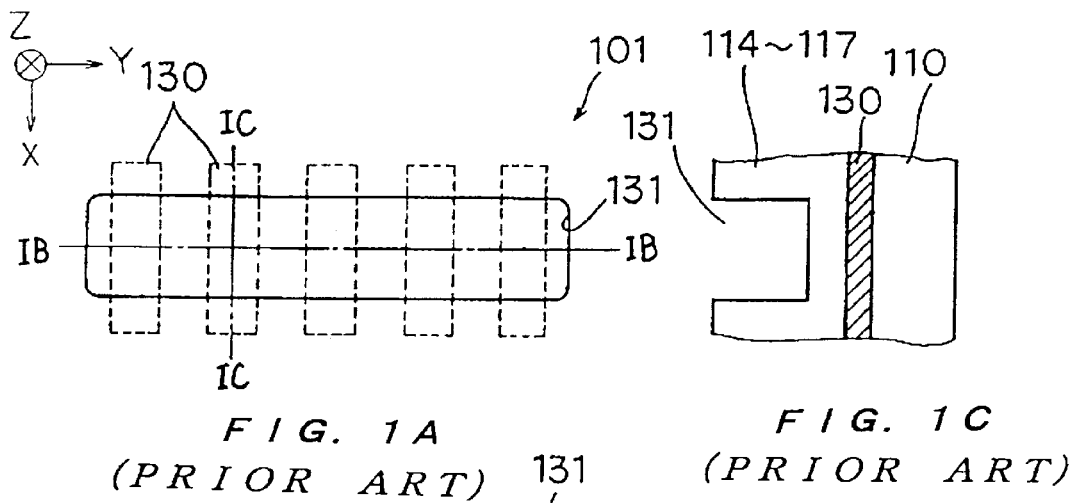
FIG. 1A
(PRIOR ART)
FIG. 1C
(PRIOR ART)
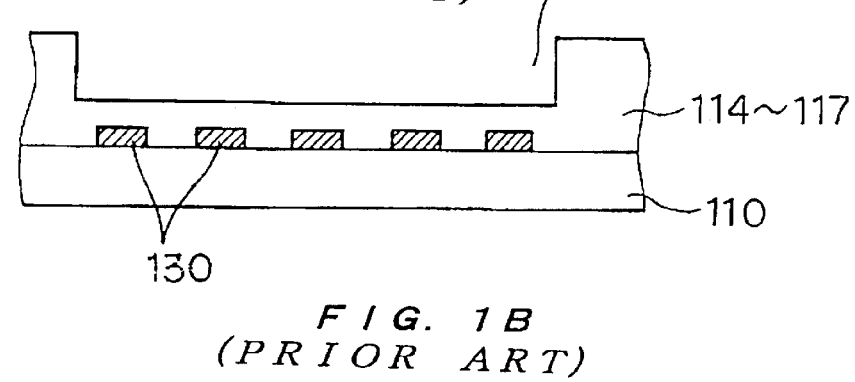
FIG. 1B
(PRIOR ART)
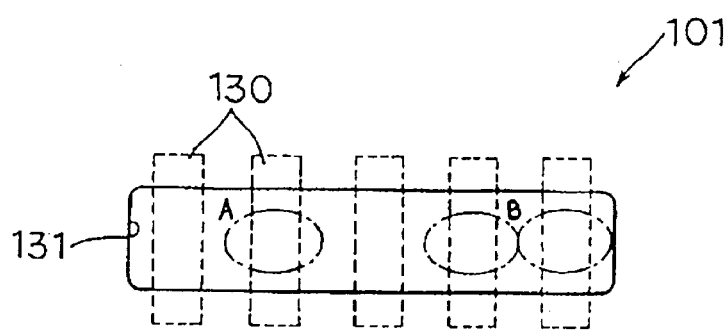
FIG. 2
(PRIOR ART)

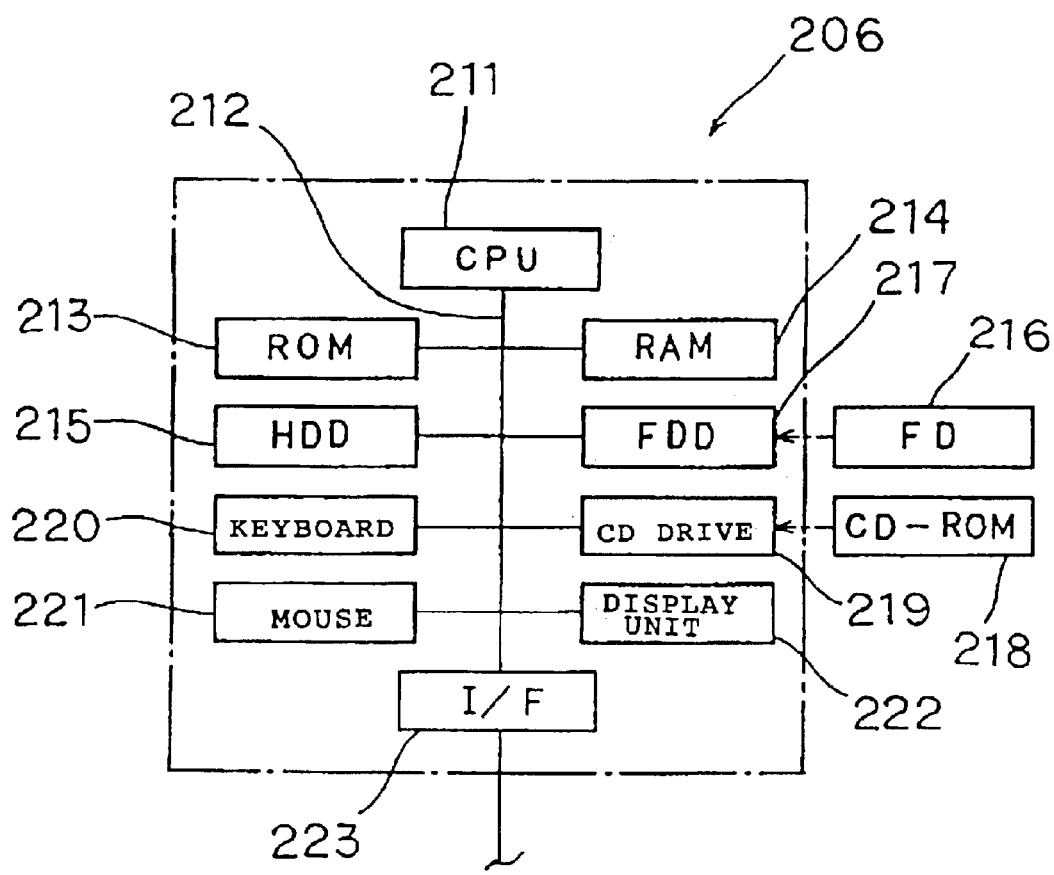
F I G. 7

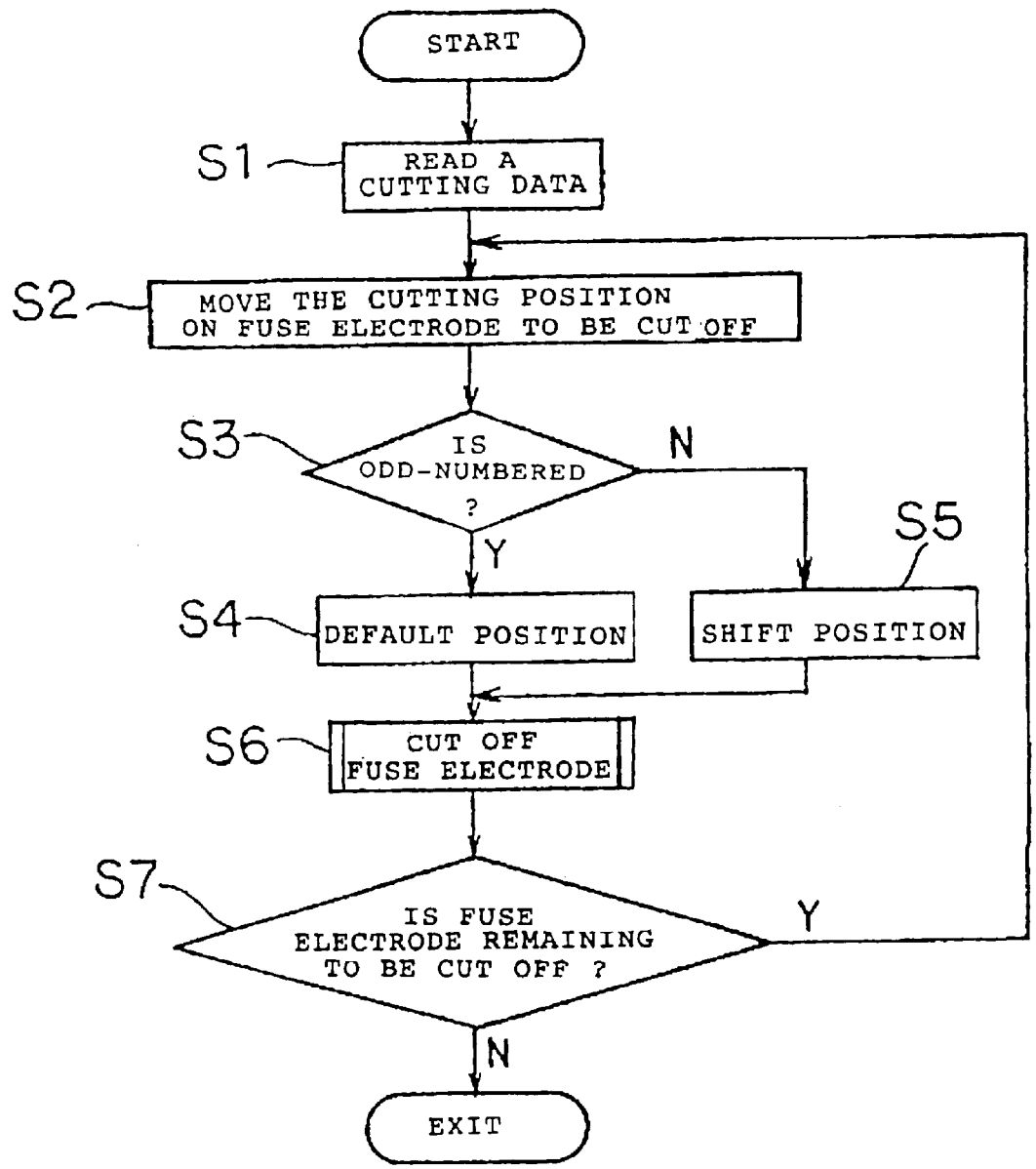
F I G. 8

APPARATUS FOR SELECTIVELY CUTTING FUSE ELECTRODES

BACKGROUND OF THE INVENTION

1. Field of the Invention

The present invention relates to a method of and an apparatus for cutting off a fuse electrode, an integrated circuit device with such a fuse electrode, and a method of manufacturing such an integrated circuit device.

2. Description of the Related Art

Various integrated circuit devices are presently used for various applications. For example, semiconductor memories such as RAMs (Random Access Memories) are used to temporarily store digital data. While attempts have been made to make such semiconductor memories greater in storage capacity and integration level, it is difficult to manufacture highly integrated semiconductor memories of large storage capacity with less defective ratio.

In view of such a difficulty, it has generally been customary at present to include spare memory cells in a semiconductor memory and replace a memory cell that has been found defective with a spare memory cell.

For example, spare word lines and a fuse ROM (Read Only Memory) are provided in advance in a semiconductor memory, and the fuse ROM stores the addresses of defective word lines and spare word lines. When address data supplied from an external source is decoded into a word address, the word address is compared with the addresses of defective word lines stored in the fuse ROM. If the word address agrees with the address of a defective word line, then a spare word line to replace the defective word line is activated.

An integrated circuit device with such a fuse ROM will be described below with reference to FIGS. 1A–1C through 4A–4D of the accompanying drawings. X and Y directions referred to hereinbelow are directions extending parallel to the surface of a circuit substrate and perpendicularly to each other, as shown in FIG. 1A, and a Z direction referred to hereinbelow is a direction extending perpendicularly to the X and Y directions. Integrated circuit device 100 which is illustrated comprises a semiconductor memory such as a RAM, for example, and, as shown in FIG. 3D, comprises fuse ROM 101 and logic circuit 102 which are mounted on one circuit substrate.

Logic circuit 102 comprises a peripheral circuit such as an address decoder and is constructed using wiring patterns in multiple layers. As shown in FIG. 4D, first wiring pattern 111 is disposed on the surface of isolating layer (or an element isolation region) 110, and first interlayer insulating film 114 is placed as a cover layer on first wiring pattern 111. Second wiring pattern 112 is disposed on the surface of first interlayer insulating film 114, and second interlayer insulating film 115 is placed as a cover layer on second wiring pattern 112. Third wiring pattern 113 is disposed on the surface of second interlayer insulating film 115, and passivation film 116 and polyimide film 117 are successively placed as a cover layer on third wiring pattern 113.

As shown in FIG. 4A, first interlayer insulating film 114 has contact hole 119 filled with a conductor that interconnects first wiring pattern 111 and second wiring pattern 112. Similarly, as shown in FIG. 4B, second interlayer insulating film 115 has contact hole 120 filled with a conductor that interconnects second wiring pattern 112 and third wiring pattern 113.

Passivation film 116 and polyimide film 117 have contact hole 121 defined therein through which third wiring pattern 113 is exposed for use as a bonding pad, for example.

As shown in FIGS. 1A–1C, fuse ROM 101 has a plurality of fuse electrodes 130 extending in the X direction and arrayed parallel to each other in the Y direction. As shown in FIG. 3D, fuse electrodes 130 are disposed on the surface of isolating layer 110, and the various films ranging from first interlayer insulating film 114 to polyimide film 117 are successively disposed on fuse electrodes 130.

Central regions of fuse electrodes 130 in the X direction are defined as a cutting position, and window 131 is defined over the central regions of fuse electrodes 130.

As shown in FIG. 3D, window 131 is in the form of a recess defined in the films and extending from the surface of polyimide film 117 to a middle position in first interlayer insulating film 114. In window 131, only first interlayer insulating film 114 remains as a layer of a thickness of about 200 (nm) over fuse electrodes 130.

As shown in FIG. 2, a laser beam emitted downwardly in the Z direction from an upper laser beam source is applied to fuse electrodes 130 of fuse ROM 101, cutting off desired fuse electrodes 130 thereby to record address data, etc. in fuse ROM 101.

A process of manufacturing integrated circuit device 100 will be described below with reference to FIGS. 3A–3D and FIGS. 4A–4D. FIGS. 3A–3D correspond respectively to FIGS. 4A–4D.

As shown in FIGS. 3A and 4A, first wiring pattern 111 of logic circuit 102 and fuse electrodes 130 of fuse ROM 101 are deposited as an aluminum layer having a thickness of 0.32 ($\mu$m) on the surface of isolating layer 110. Then, first interlayer insulating film 114 of SiO$_2$ or NSG (Nondope Silicate Glass) having a thickness of about 0.5 ($\mu$m) is grown on the entire surface of isolating layer 110.

Thereafter, contact hole 119 extending to first wiring pattern 111 is defined in first interlayer insulating film 114, and second wiring pattern 112 connected to first wiring pattern 111 via contact hole 119 is deposited as an aluminum layer having a thickness of 0.32 ($\mu$m) on the surface of first interlayer insulating film 114.

Then, second interlayer insulating film 115 of SiO$_2$ or NSG having a thickness of about 1.0 ($\mu$m) is grown on the entire surface of first interlayer insulating film 114. As shown in FIGS. 3B and 4B, contact hole 120 extending to second wiring pattern 112 is defined in second interlayer insulating film 115. Recess 132 is defined in second interlayer insulating film 115 at the position of window 131 of fuse ROM 101, leaving a layer of second interlayer insulating film 115 having a thickness of about 1300 (nm) in an upper portion of fuse ROM 101.

Then, as shown in FIGS. 3C and 4C, third wiring pattern 113 connected to second wiring pattern 112 via contact hole 120 is deposited as an aluminum layer having a thickness of 0.80 ($\mu$m) on the surface of second interlayer insulating film 115. Passivation film 116 of SiN having a thickness of about 1.0 ($\mu$m) and polyimide film 117 having a thickness of about 6.0 ($\mu$m) are successively grown on the entire surface of second interlayer insulating film 115.

As shown in FIGS. 3D and 4D, large-size contact hole 121 extending to the surface of third wiring pattern 113 and window 131 of fuse ROM 101 are defined in passivation film 116 and polyimide film 117, leaving a layer of polyimide film 117 and passivation film 116 having a thickness of about 200 (nm) in the upper portion of fuse ROM 101.

According to the above process of manufacturing integrated circuit device 100, fuse electrodes 130 and first wiring pattern 111 can be fabricated in one step, and contact holes 120, 121 and window 131 can be defined in one step. Therefore, fuse ROM 101 and logic circuit 102 can be produced simultaneously.

In integrated circuit device 100, as described above, desired ones of plural fuse electrodes 130 arrayed in the Y direction are cut off by a laser beam to record desired data in fuse ROM 101.

When fuse electrodes 130 are cut off by the laser beam, their components are melted and scattered around. No problem arises from scattered fragments of the components if only one fuse electrode 130 is cut off and adjacent fuse electrodes 130 are not cut off, as indicated by an area A in FIG. 2. However, if adjacent fuse electrodes 130 are cut off, as indicated by an area B in FIG. 2, then they may be short-circuited by scattered fragments of the components.

Fuse ROM 101 is also required to be increased in integration level as in the case with logic circuits and memory cells. At present, fuse electrodes 130 are arrayed at such spaced intervals as not to damage adjacent fuse electrodes 130 with the cutting laser beam. Specifically, since the cutting laser beam has a spot diameter of 2.5 ($\mu$m), fuse electrodes 130 each having a width of 1.0 ($\mu$m) are arrayed at spaced intervals of 3.0 ($\mu$m).

However, if the number of fuse electrodes 130 is increased, then the area taken up by fuse ROM 101 is unduly increased.

SUMMARY OF THE INVENTION

It is therefore an object of the present invention to provide a method of and an apparatus for cutting off a fuse electrode without short-circuiting adjacent fuse electrodes.

Another object of the present invention is to provide an integrated circuit device which allows a fuse ROM to be highly integrated, and a method of manufacturing such an integrated circuit device.

In order to achieve the above objects, in a method of and an apparatus for cutting off a fuse electrode according to the present invention, when adjacent ones of a plurality of fuse electrodes extending parallel to each other are cut off by a laser beam, cutting positions on the adjacent fuse electrodes are set to positions which are different from each other in a direction in which the fuse electrodes extend.

If adjacent fuse electrodes are disposed in respective layers which are different from each other, then a laser beam is focused onto only a fuse electrode in one of the layers to be cut off.

In this manner, the adjacent fuse electrodes are prevented from being short-circuited by fragments of components thereof that are scattered when the laser beam is applied to cut off the fuse electrodes. An integrated circuit device produced by cutting off selected fuse electrodes is thus made highly reliable.

An integrated circuit device according to the present invention has a plurality of windows associated respectively with the fuse electrodes and including windows at the cutting positions on adjacent fuse electrodes. In the windows, an insulating film grown on the fuse electrodes have a thickness which allows a laser beam to pass therethrough to cut off the fuse electrodes, and in regions other than the windows, an insulating film grown on the fuse electrodes have a thickness which prevents the laser beam from damaging the fuse electrodes. Of the fuse electrodes of the integrated circuit device, adjacent fuse electrodes are disposed in layers different from each other.

Not only the adjacent fuse electrodes are prevented from being short-circuited by fragments of components thereof that are scattered when the laser beam is applied to cut off the fuse electrodes, but also no problem occurs when the fuse electrodes arrayed at a high density corresponding to spaced intervals smaller than the spot diameter of the laser beam are cut off by the laser beam. The area taken up by the integrated circuit device can be reduced by increasing the level of integration of a fuse ROM.

In a method of manufacturing an integrated circuit device according to the present invention, fuse electrodes are fabricated together with a wiring pattern of a logic circuit, and a contact hole reaching the wiring pattern and windows are defined in an insulating layer grown on the fuse electrodes and the wiring pattern. Since the logic circuit and a fuse ROM can simultaneously be fabricated, the integrated circuit device can be manufactured with increased productivity.

The above and other objects, features, and advantages of the present invention will become apparatus from the following description with reference to the accompanying drawings which illustrate examples of the present invention.

BRIEF DESCRIPTION OF THE DRAWINGS

FIG. 1A is a plan view of a structure of a conventional fuse ROM;

FIG. 1B is a cross-sectional view taken along line IB—IB of FIG. 1A;

FIG. 1C is a cross-sectional view taken along line IC—IC of FIG. 1A;

FIG. 2 is a plan view showing the manner in which fuse electrodes are cut off by a conventional fuse electrode cutting apparatus;

FIG. 7 is a block diagram of an operation controller in the fuse electrode cutting apparatus shown in FIG. 6;

FIG. 8 is a flowchart of an operation sequence of a method of cutting off a fuse electrode according to the first embodiment of the present invention;

DETAILED DESCRIPTION OF THE PREFERRED EMBODIMENTS

Figure 3A:
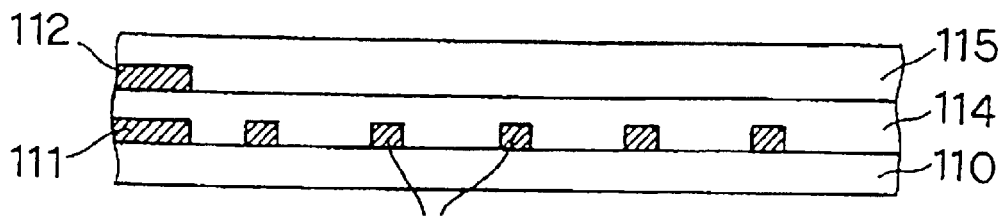
FIGS. 3A–3D and 4A–4D are cross-sectional views showing a process of manufacturing a conventional integrated circuit device.
Figure 3B:
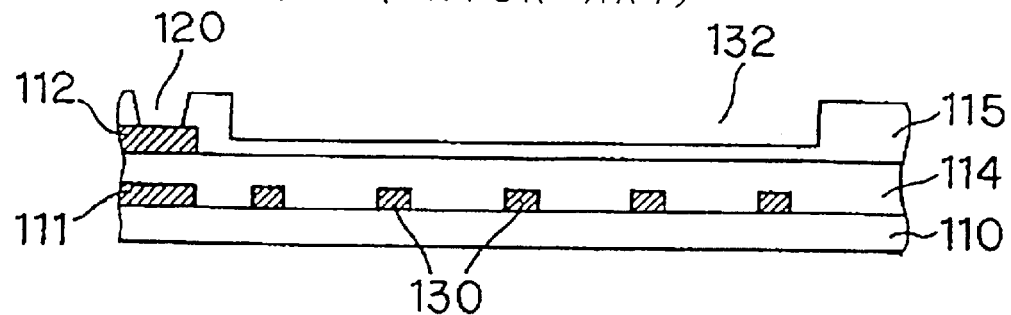
Figure 3C:
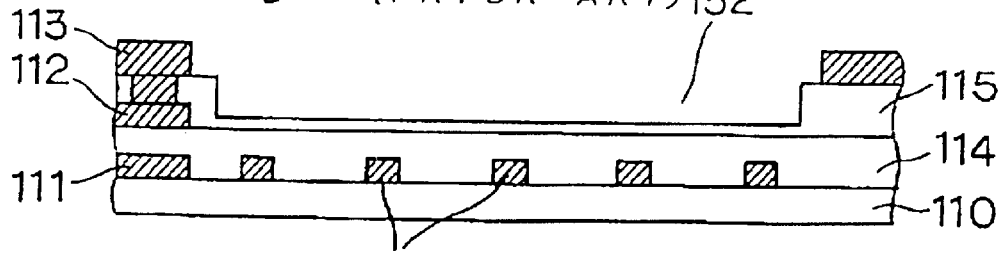
Figure 3D:
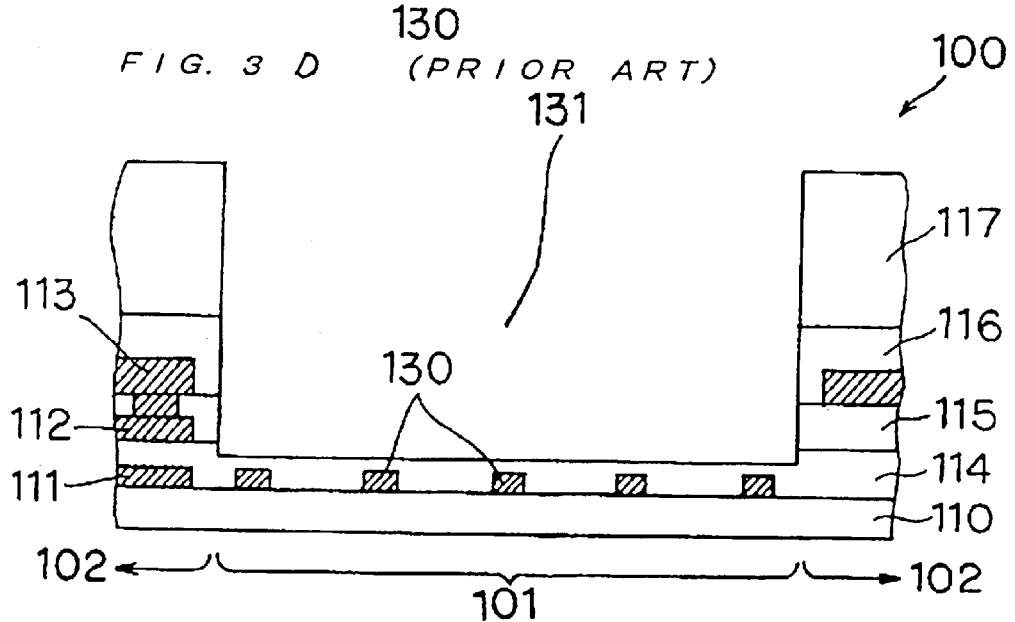
Figure 4A:
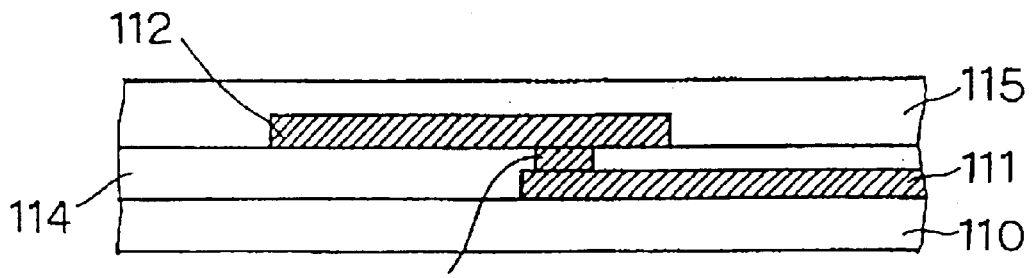
Figure 4B:
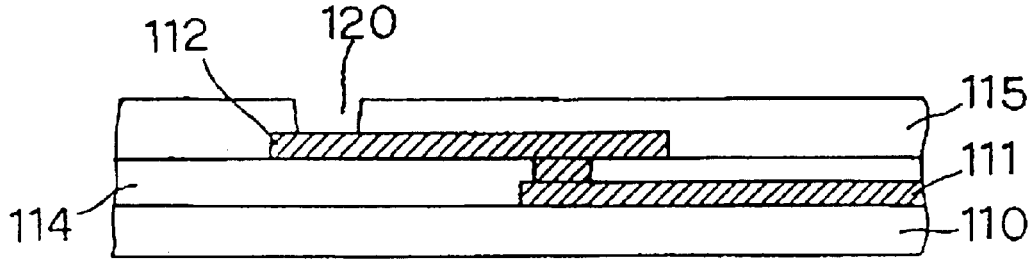
Figure 4C:
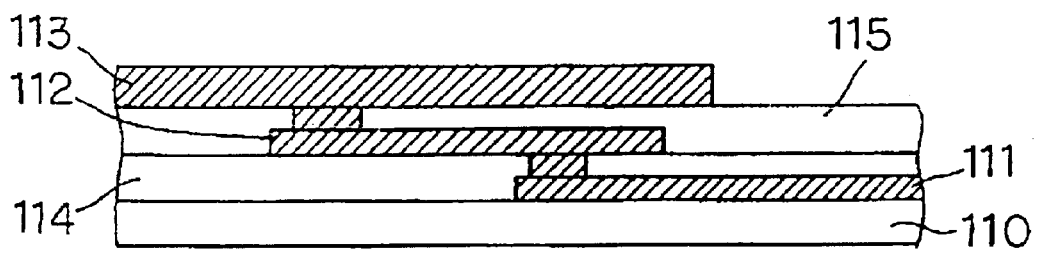
Figure 4D:
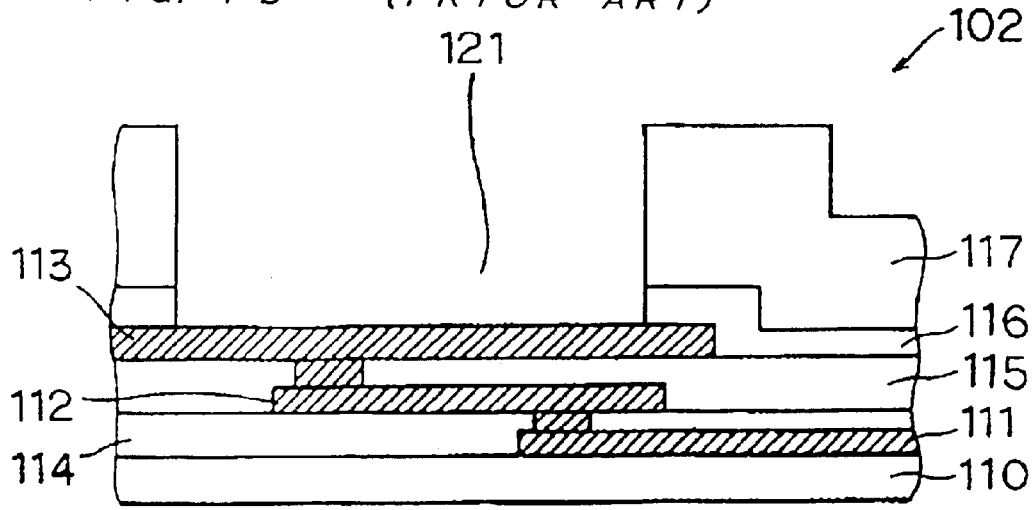

1st Embodiment:

A first embodiment of the present invention will first be described below with reference to the drawings.

Integrated circuit devices according to embodiments of the present invention to be described below have parts identical to those of the conventional integrated circuit device, and those identical parts are denoted by identical reference characters and will not be described in detail below. X and Y directions referred to hereinbelow are directions extending parallel to the surface of a circuit substrate and perpendicularly to each other, and a Z direction referred to hereinbelow is a direction extending perpendicularly to the X and Y directions.

Fuse electrode cutting apparatus 200 for carrying out a method of cutting off a fuse electrode according to the first embodiment of the present invention will be described below.

Figure 6:
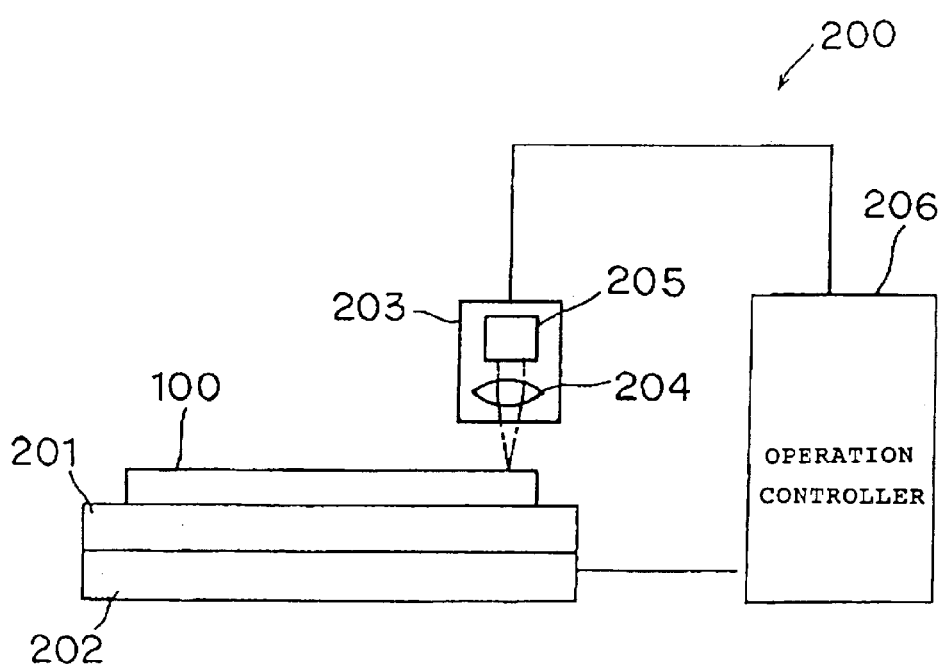
FIG. 6 is a block diagram of a fuse electrode cutting apparatus according to the present invention.

As shown in FIG. 6, fuse electrode cutting apparatus 200 comprises holding stage 201 for detachably holding integrated circuit device 100 which comprises fuse ROM 101 and logic circuit 102, slide unit 202 on which holding stage 201 is movably supported, laser unit 203 disposed upwardly of holding stage 201 for applying a laser beam to fuse ROM 101, and operation controller 206 for controlling slide unit 202 and laser unit 203.

Laser unit 203 has laser beam source 205 and condensing lens 204. A laser beam emitted from laser beam source 205 is focused by condensing lens 204 onto a cutting position on fuse electrode 130 to be cut off.

As shown in FIG. 7, operation controller 206 has CPU (Central Processing Unit) 211 to which there are connected, by bus lines 222, ROM 213, RAM 214, HDD (Hard Disk Drive) 215, FDD (Floppy Disk Drive) 217 for loading FD (Floppy Disk) 216 therein, CD (Compact Disk) drive 219 for loading CD-ROM 218 therein, keyboard 220, mouse 221, display unit 222, and communication I/F (InterFace) 223.

A control program and data for enabling CPU 211 to perform various processing operations are stored in at least one of data storage mediums including ROM 213, RAM 214, HDD 215, FD 216, and CD-ROM 218. The control program is installed from the data storage medium into HDD 215, from which it is loaded into RAM 214 when operation controller 206 is activated. CPU 211 successively reads instructions of the control program from RAM 214, and executes various processing operations of operation controller 206, as described below, according to the control program.

Since CPU 211 reads an appropriate program and performs various processing operations according to the read program, it enables operation controller 206 to perform various functions as a cutting storage means, a cutting control means, and a position control means.

The cutting storage means is a storage area constructed in HDD 215, for example, and stores data (hereinafter referred to as "cutting data") indicative of whether each of fuse electrodes 130 of fuse ROM 101 is cut off or not.

The cutting control means has a function to control operation of slide unit 202 and laser unit 203, and moves holding stage 201 in the Y direction to position each of fuse electrodes 130 of fuse ROM 101 in a position radiated by the laser beam, and also turns on and off the laser beam emitted from laser unit 203.

The position control means has a function to control operation of laser unit 203, and controls condensing lens 204 of laser unit 203 thereby to change the position in the X direction of the laser beam applied to the fuse ROM 101.

Figure 5:
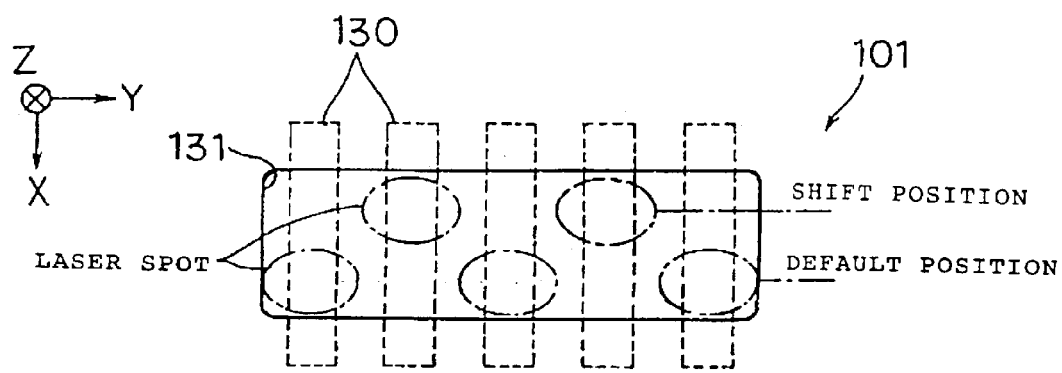
FIG. 5 is a plan view of a structure of an integrated circuit device according to a first embodiment of the present invention, the view showing the manner in which fuse electrodes are cut off.

In fuse electrode cutting apparatus 200, as shown in FIG. 5, a position shifted to one side from a central position on fuse electrodes 130 in the X direction is defined as a default position, and a position shifted to the other side as a shift position. The cutting position on odd-numbered fuse electrodes 130 in the Y direction is set to the default position, and the cutting position on even-numbered fuse electrodes 130 in the Y direction is set to the shift position.

The various functions of operation controller 206 may be performed by the operator who enters commands through keyboard 220 while monitoring display unit 222, etc. However, those various functions are primarily performed by CPU 211 according to the control program stored in the data storage medium.

Fuse electrode cutting apparatus 200 is capable of cutting off, with a laser beam, desired fuse electrodes 130 in fuse ROM 101 of integrated circuit device 100 which is of the same structure as with the conventional integrated circuit device.

Integrated circuit device 100 is held on holding stage 201 such that the direction of fuse electrodes 130 shown in FIG. 5, i.e., the X direction, agrees with the direction of holding stage 201 shown in FIG. 6 which is perpendicular to the sheet of FIG. 6, and the direction in which fuse electrodes 130 are arrayed at spaced intervals, i.e., the Y direction, agrees with the direction of holding stage 201 parallel to the sheet of FIG. 6.

The cutting data of each of fuse electrodes 130 of integrated circuit device 100 is held in HDD 215 of operation controller 206. When a command to start a process of cutting off fuse electrodes 130 is entered via keyboard 220 by the operator, CPU 211 of operation controller 206 reads the cutting data of fuse electrode 130 from HDD 215 in step S1 shown in FIG. 8, and controls operation of slide unit 202 and laser unit 203 according to the cutting data thus read.

CPU 211 controls slide unit 202 to laterally move holding stage 201 on which integrated circuit device 100 is mounted, so that the position where the laser beam is applied from laser unit 203, i.e., the laser beam applied position, agrees with the cutting position on fuse electrode 130 to be cut off, in step S2.

CPU 211 determines whether fuse electrode 130 to be cut off is an odd-numbered or even-numbered fuse electrode in the Y direction in step S3. If fuse electrode 130 to be cut off is an odd-numbered fuse electrode, then CPU 211 controls laser unit 203 to displace condensing lens 204 to move the laser beam applied position to the default position in window 131 in step S4. If fuse electrode 130 to be cut off is an even-numbered fuse electrode, then CPU 211 controls laser unit 203 to displace condensing lens 204 to move the laser beam applied position to the shift position in window 131 in step S5. Then, CPU 211 controls laser unit 203 to emit and apply the laser beam to cut off fuse electrode 130 in step S6.

Finally, CPU 211 determines whether there is fuse electrode 130 remaining to be cut off or not in step S7. If there is fuse electrode 130 remaining to be cut off, then control returns to step S2 to repeat the processing from step S2 to step S6. If there is no fuse electrode 130 remaining to be cut off, then the operation sequence shown in FIG. 8 is put to an end.

As described above, fuse electrode cutting apparatus 200 cuts off adjacent fuse electrodes 130 at respective different positions in the X direction. Therefore, even the components of the adjacent fuse electrodes 130 are scattered around when they are cut off by the laser beam, the adjacent fuse electrodes 130 are less liable to be short-circuited. Accordingly, integrated circuit device 100 in which desired data have been recorded in fuse ROM 101 by fuse electrode cutting apparatus 200 is prevented from suffering malfunctions of fuse ROM 101, and hence is highly reliable.

The above first embodiment is not limited to the details described above, but may be modified in various ways. For example, in the illustrated embodiment, the cutting position on fuse electrode 130 is displaced alternately to the default position or the shift position depending on whether fuse electrode 130 is odd-numbered or even-numbered in the Y direction. However, fuse electrodes 130 may be displaced into successive positions to one side in the X direction or a certain number of fuse electrodes 130 may be displaced together in the X direction. These modifications make it necessary to enlarge window 131 in fuse ROM 101 in the X direction. For this reason, it is preferable to displace the cutting position on fuse electrode 130 alternately to the default position or the shift position.

In the illustrated embodiment, the cutting position on fuse electrode 130 is predetermined depending on whether fuse electrode 130 is odd-numbered or even-numbered in the Y direction. However, the cutting position on fuse electrode 130 may initially be set to the default position irrespective of whether fuse electrode 130 is odd-numbered or even-numbered, and the cutting position on adjacent fuse electrode 130 may be set to the shift position when adjacent fuse electrode 130 is to be cut off.

In the illustrated embodiment, the cutting positions on a plurality of fuse electrodes 130 are displaced alternatively to the default position and the shift position when those fuse electrodes 130 are successively cut off. However, it is possible to initially cut off all fuse electrodes 130 whose cutting positions are in the default position and then cut off fuse electrodes 130 whose cutting positions are in the shift position.

In the illustrated embodiment, it is assumed that fuse electrodes 130 and first wiring pattern 111 of logic circuit 102 are deposited as the same aluminum layer. However, fuse electrodes 130 and wiring patterns may be made of any conductive material such as gold, copper, polysilicon, or the like. Alternatively, fuse electrodes 130 and wiring patterns of logic circuit 102 may be made separately from each other.

In the illustrated embodiment, CPU 211 operates according to the control program stored in RAM 214 to perform the various functions of operation controller 206. However, these functions or means may be hardware-implemented, or some of the functions or means may be performed by CPU 211 according to the control program whereas the other functions or means may be hardware-implemented.

In the illustrated embodiment, when operation controller 206 is activated, the control program installed from CD-ROM 218 or the like into HDD 215 is copied to RAM 214, and the control program stored in RAM 214 is executed by CPU 211 while it is being read by CPU 211. However, the control program may be used by CPU 211 while it is being stored in HDD 215, or the control program which has been stored in advance in ROM 213 may be used by CPU 211.

The control program may be stored in FD 216 or CD-ROM 218 as the data storage medium, and may directly be installed from FD 216 or CD-ROM 218 into HDD 215 or RAM 214. Alternatively, the control program may not be installed from FD 216 or CD-ROM 218, but CPU 211 may read the control program directly from FD 216 or CD-ROM 218 and execute the read control program.

Stated otherwise, when the various functions or means of operation controller 206 are to be performed by CPU 211, it is sufficient for the control program to be read and executed by CPU 211. The control program for performing the above functions or means may be constructed of a combination of plural software programs, and the single data storage medium may store only a least program required to perform the various functions of operation controller 206.

For example, if application software is supplied from the data storage medium such as CD-ROM 218 or the like to operation controller 206 in which an existing operating system has been installed, then since the control program for performing the various functions of operation controller 206 is realized by a combination of the application software and the operating system, any functions depending on the operation system may be omitted from the application software stored in the data storage medium.

The process of supplying the control program to operation controller 206 is not limited to the process of loading the data storage medium directly into operation controller 206. For example, the control program may be stored in a data storage medium of a host computer, and supplied from the host computer via a communication network to a terminal computer. In such an arrangement, the terminal computer may download the control program into its own data storage medium, and execute the control program in a stand-alone environment. However, it is also possible for the terminal computer to execute the control program by communicating directly with the host computer on a real-time basis. In such a case, the system made up of the host computer, the terminal computer, and the communication network corresponds to operation controller 206.

The data storage medium referred to in the present description may be a hardware component which stores the control program for enabling the computer to perform the various functions. For example, the data storage medium may be a ROM, a HDD, a CD-ROM or a FD which can removably be loaded in the computer.

The computer referred to in the present description may be any apparatus for carrying out certain processing operations according to a program, and may be of any structure insofar as it comprises a CPU, a ROM, a RAM, and an I/F that are interconnected. Enabling a computer to perform various functions according to a program should be interpreted to include controlling various devices with the computer.

2nd Embodiment:

A second embodiment of the present invention will first be described below with reference to the drawings.

Integrated circuit device 300 according to the second embodiment comprises fuse ROM 301 and logic circuit 102 which are mounted on one circuit substrate, as with the integrated circuit device according to the first embodiment, and is similar to the integrated circuit device according to the first embodiment except that window 302 in fuse ROM 301 has a different pattern configuration.

Figure 9:
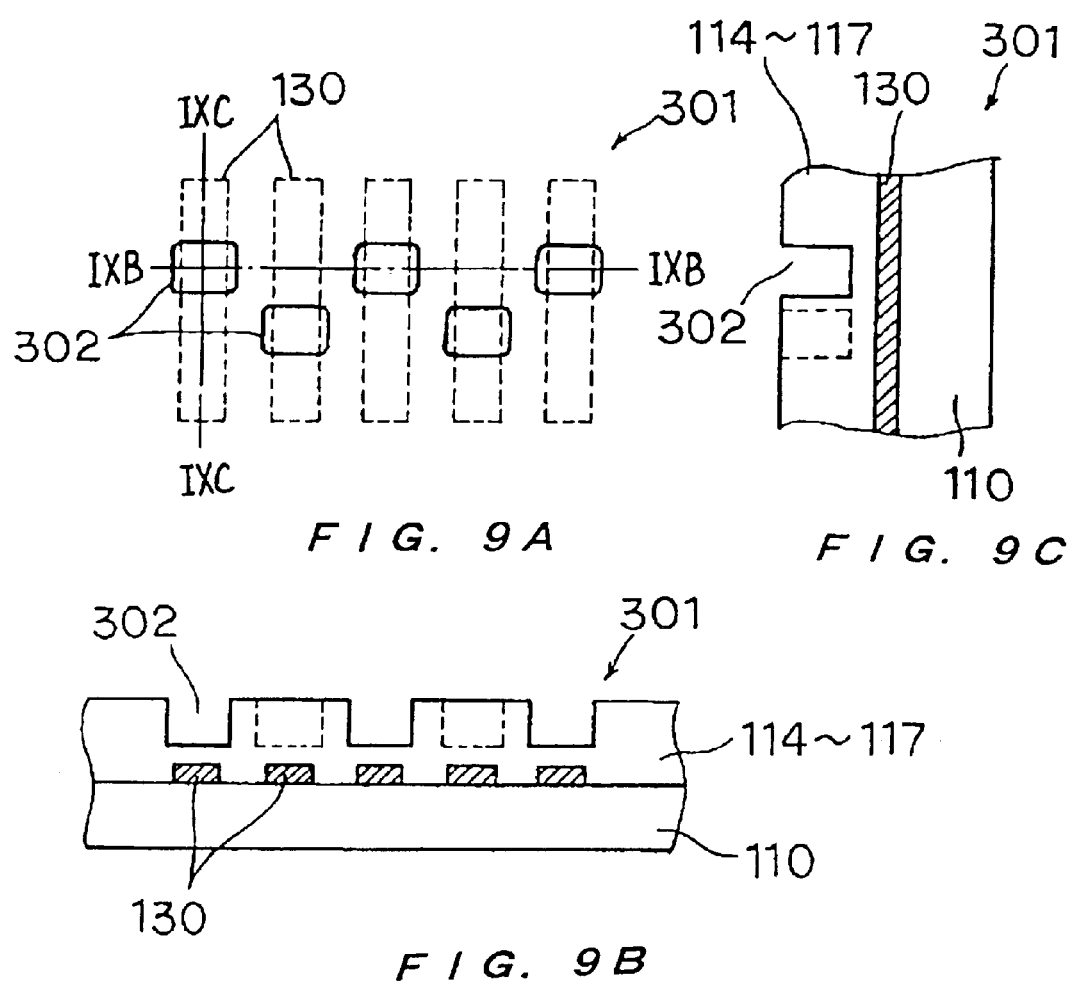
FIG. 9A is a plan view of a structure of an integrated circuit device according to a second embodiment of the present invention, the view showing the manner in which fuse electrodes are cut off.
FIG. 9B is a cross-sectional view taken along line IXB—IXB of FIG. 9A.
FIG. 9C is a cross-sectional view taken along line IXC—IXC of FIG. 9A.

As shown in FIGS. 9A through 9C, fuse ROM 301 has a plurality of windows 302 defined respectively in plural fuse electrodes 130 that are arrayed at spaced intervals in the Y direction. Of these windows 302, the windows over odd-numbered fuse electrodes 130 are defined in the default position, and the windows over even-numbered fuse electrodes 130 are defined in the shift position. Windows 302 over adjacent ones of fuse electrodes 130 are different from each other in the X direction.

Windows 302 are in the form of recesses defined in the first interlayer insulating film and other films over fuse electrodes 130. In windows 302, the interlayer insulating film has a thickness of about 200 (nm) which is small enough to allow the applied laser beam to cut off desired fuse electrodes 130. In regions other than windows 302, the interlayer insulating film has a thickness of about 1.5 ($\mu$m) which is large enough to prevent the applied laser beam from damaging fuse electrodes 130.

In integrated circuit device 300 according to the second embodiment, fuse electrodes 130 in fuse ROM 301 are cut off by fuse electrode cutting apparatus 200 according to the first embodiment. Specifically, fuse electrode cutting apparatus 200 determines whether fuse electrode 130 to be cut off is odd-numbered or even-numbered in the Y direction. If fuse electrode 130 to be cut off is odd-numbered, then fuse electrode cutting apparatus 200 displaces the laser beam applied position to the default position to position the laser beam applied position in window 302. If fuse electrode 130 to be cut off is even-numbered, then fuse electrode cutting apparatus 200 displaces the laser beam applied position to the shift position to position the laser beam applied position in window 302.

In fuse ROM 301, because adjacent fuse electrodes 130 are cut off in respective positions displaced in the X direction, they are less likely to be short-circuited by scattered fragments of the components of fuse electrodes 130 that are cut off. Fuse ROM 301 is thus prevented from malfunctioning, and hence can be manufactured with an increased yield.

In fuse ROM 301 of integrated circuit device 300, furthermore, the first interlayer insulating film has a thickness large enough to prevent fuse electrodes 130 from being damaged by the applied laser beam in positions other than windows 302. Therefore, when any desired fuse electrode 130 is cut off by the laser beam, adjacent fuse electrode 130 that is free of windows is not damaged even if it is irradiated with the laser beam.

Since no problem occurs when fuse electrodes 130 arrayed at a high density corresponding to spaced intervals smaller than the spot diameter of the laser beam are cut off by the laser beam, the area taken up by integrated circuit device 300 can be reduced by increasing the level of integration of fuse ROM 301. For example, if the spot diameter of the laser beam is 2.5 ($\mu$m) and the width of each fuse electrode 130 is 1.0 ($\mu$m), then the spacing between adjacent fuse electrodes 130 can be reduced to 1.0 ($\mu$m). Therefore, the width of fuse ROM 301 can be reduced to about half the width of fuse ROM in the conventional integrated circuit device.

A method of manufacturing integrated circuit device 300 will be described below with reference to FIGS. 10A through 10D. FIGS. 10A through 10D also correspond respectively to FIGS. 4A–4D.

Figure 10:
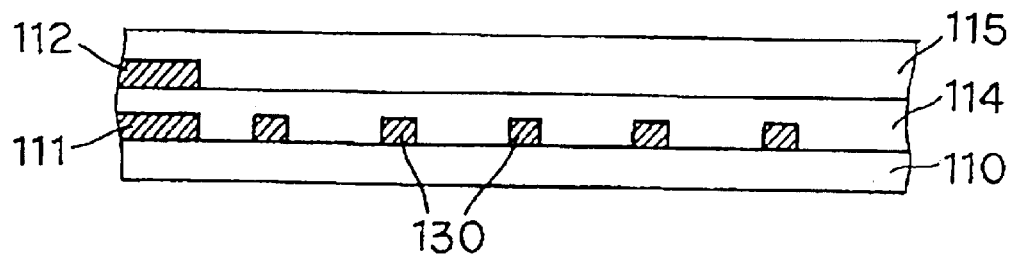
FIGS. 10A–10D are cross-sectional views showing successive steps of a method of cutting off a fuse electrode according to the second embodiment of the present invention.
Figure 10:
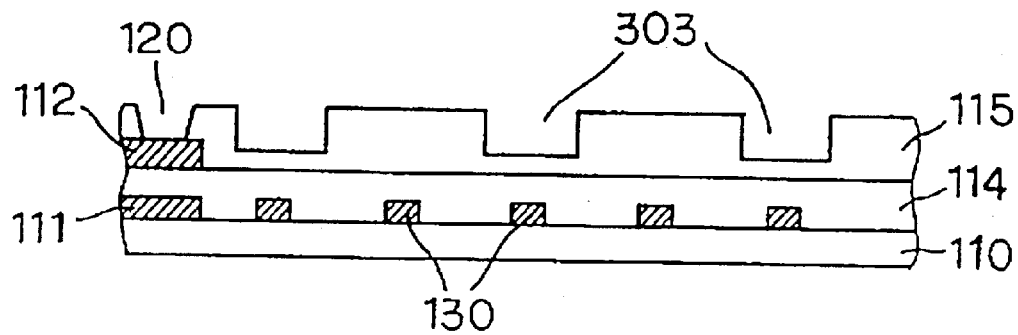
Figure 10:
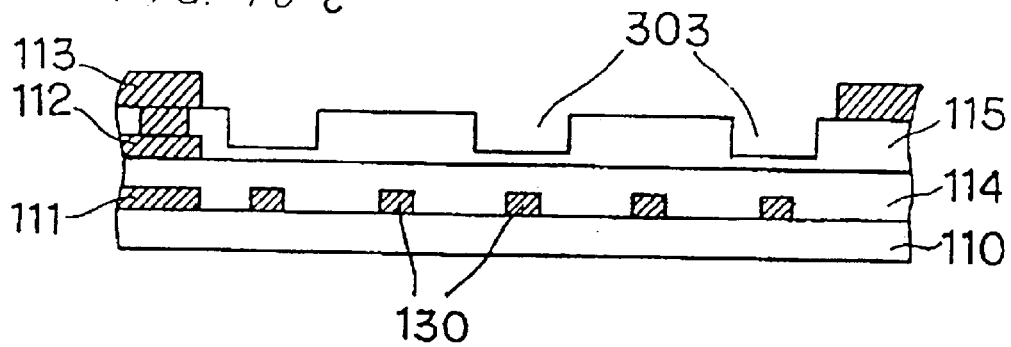
Figure 10:
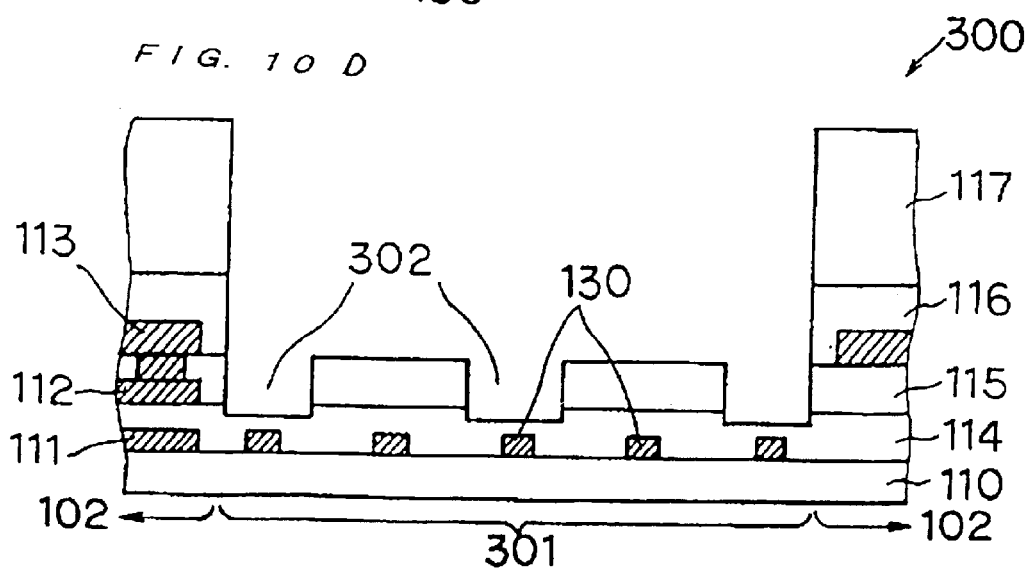

As shown in FIG. 10A, first wiring pattern 111 of logic circuit 102 and fuse electrodes 130 of fuse ROM 301 are deposited as an aluminum layer on the surface of isolating layer 110. Then, contact hole 119 reaching first wiring pattern 111 is defined in first interlayer insulating film 114 grown on the entire surface of isolating layer 110, and second wiring pattern 112 connected to first wiring pattern 111 via contact hole 119 is deposited on the surface of first interlayer insulating film 114.

Then, second interlayer insulating film 115 is grown on the entire surface of first interlayer insulating film 114. As shown in FIG. 10B, contact hole 120 reaching second wiring pattern 112 is defined in second interlayer insulating film 115, and recesses 303 are defined in second interlayer insulating film 115 at the positions of windows 302 in fuse ROM 301.

Recesses 303 are defined in association with respective fuse electrodes 130 arrayed in the Y direction. Recesses 303 are disposed in the default position with respect to odd-numbered fuse electrodes 130, and in the shift position with respect to even-numbered fuse electrodes 130.

Then, as shown in FIG. 10C, third wiring pattern 113 connected to second wiring pattern 112 via contact hole 120 is deposited on the surface of second interlayer insulating film 115, and passivation film 116 and polyimide film 117 are successively grown on the entire surface of second interlayer insulating film 115.

As shown in FIG. 10D, contact hole 121 reaching the surface of third wiring pattern 113 and windows 302 in fuse ROM 301 are defined respectively in polyimide film 117 and passivation film 116.

Polyimide film 117 and passivation film 116 are removed from the entire region of fuse ROM 301, leaving a large recess in the position of fuse ROM 301. Plural windows 302 are defined in communication with the bottom of the large recess.

The layer over fuse electrodes 130 has a thickness of about 200 (nm) in the positions of windows 302 and a thickness of about 1.5 ($\mu$m) in the positions other than windows 302.

In integrated circuit device 300, first wiring pattern 111 and fuse electrodes 130 can be fabricated in one step, and contact holes 120, 121 and windows 302 can be defined in one step. Therefore, logic circuit 102 and fuse ROM 301 can be produced simultaneously, the integrated circuit device can be manufactured with increased productivity.

The above second embodiment is not limited to the details described above, but may be modified in various ways without departing from its scope. For example, in the illustrated embodiment, the positions of windows 302 are displaced alternately in the X direction depending on whether fuse electrode 130 is odd-numbered or even-numbered. However, windows 302 may be displaced into successive positions to one side in the X direction or a certain number of windows 302 may be displaced together in the X direction.

In the illustrated embodiment, fuse electrodes 130 are deposited, together with first wiring pattern 111 of logic circuit 102, on the surface of isolating layer 110. However, fuse electrodes 130 may be deposited, together with second wiring pattern 112 or third wiring pattern 113 of logic circuit 102, on an intermediate layer.

3rd Embodiment:

A third embodiment of the present invention will first be described below with reference to the drawings.

Figure 11:
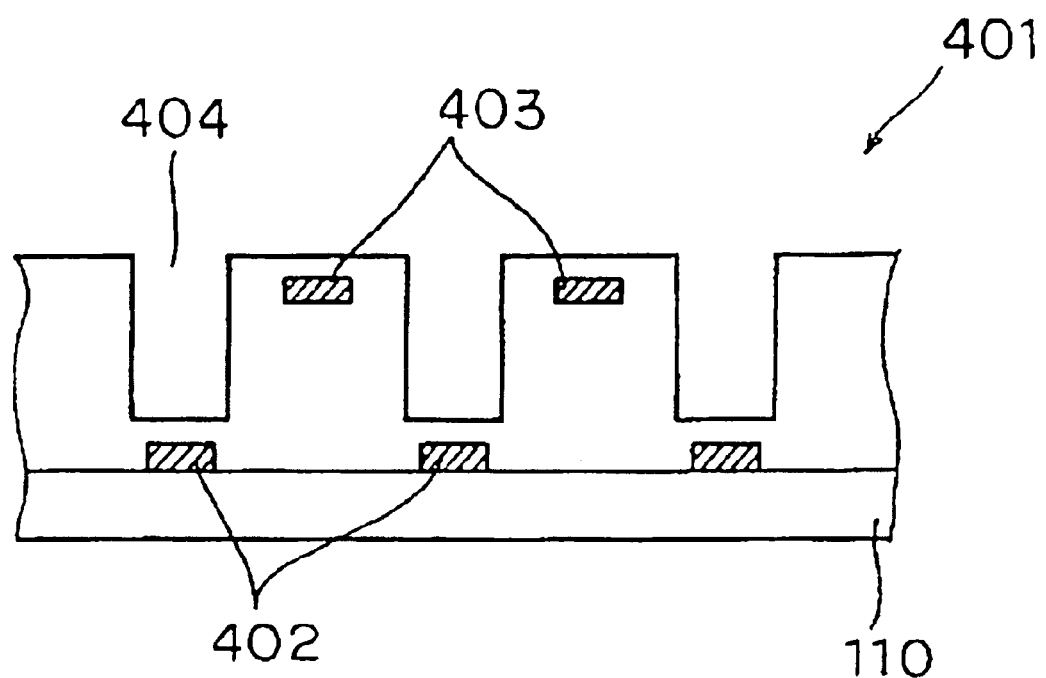
FIG. 11 is a sectional side elevational view of a structure of an integrated circuit device according to a third embodiment of the present invention.

As shown in FIG. 11, integrated circuit device 400 according to the third embodiment includes fuse electrodes of fuse ROM 401 which are disposed in a plurality of layers (two layers in FIG. 11). For example, odd-numbered fuse electrodes 402 in the Y direction are disposed in a lower layer, and even-numbered electrodes 403 in the Y direction are disposed in an upper layer.

In integrated circuit device 400 according to the third embodiment, furthermore, a single recess is defined in the entire region of fuse ROM 401, and windows 404 are defined at the positions of fuse electrodes 402 in the lower layer. A cover layer 405 having a thickness of about 200 (nm) for allowing a laser beam to pass therethrough to cut off fuse electrodes is deposited substantially uniformly in the entire region of fuse ROM 401.

A fuse electrode cutting apparatus used in the present embodiment determines whether fuse electrode to be cut off is an odd-numbered or even-numbered fuse electrode in the Y direction. If fuse electrode 130 to be cut off is an odd-numbered fuse electrode, then the fuse electrode cutting apparatus focuses the laser beam onto fuse electrode 402 in the lower layer. If fuse electrode 130 to be cut off is an even-numbered fuse electrode, then the fuse electrode cutting apparatus focuses the laser beam onto fuse electrode 403 in the upper layer.

In integrated circuit device 400, since adjacent fuse electrodes are cut off at respective positions that are different in the thickness direction of the semiconductor substrate, they are less likely to be short-circuited by scattered fragments of the components of fuse electrodes that are cut off. Fuse ROM 401 is thus prevented from malfunctioning, and hence can be manufactured with an increased yield.

In fuse ROM 401, the thickness of the insulating layer disposed between fuse electrodes is selected such that only those fuse electrodes onto which the laser beam is focused are cut off, and those fuse electrodes which are out of focus with the laser beam are not damaged.

No problem arises when fuse electrodes arrayed at a high density corresponding to spaced intervals smaller than the spot diameter of the laser beam are cut off by the laser beam. Consequently, the area taken up by integrated circuit device 400 can be reduced by increasing the level of integration of fuse ROM 401.

A method of manufacturing integrated circuit device 400 will be described below with reference to FIGS. 12A through 12D. FIGS. 12A through 12D also correspond respectively to FIGS. 4A–4D.

Figure 12A:
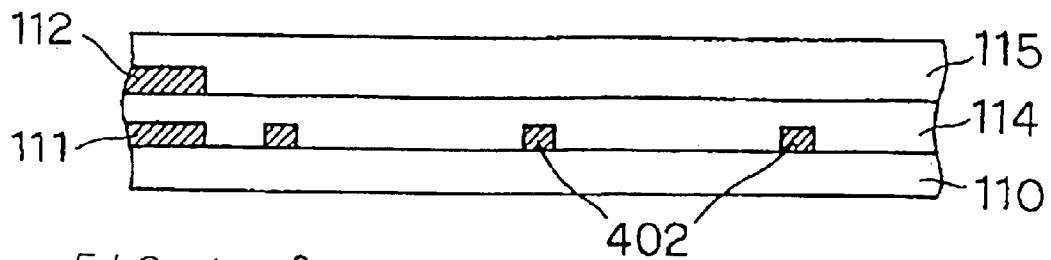
FIGS. 12A through 12D are cross-sectional views showing successive steps of a method of cutting off a fuse electrode according to the third embodiment of the present invention.

As shown in FIG. 12A, first wiring pattern 111 of logic circuit 102 and fuse electrodes 402 in the lower layer are deposited as an aluminum layer on the surface of isolating layer 110.

Then, contact hole 119 reaching first wiring pattern 111 is defined in first interlayer insulating film 114 grown on the entire surface of isolating layer 110, and second wiring pattern 112 connected to first wiring pattern 111 via contact hole 119 is deposited on the surface of first interlayer insulating film 114.

Figure 12B:
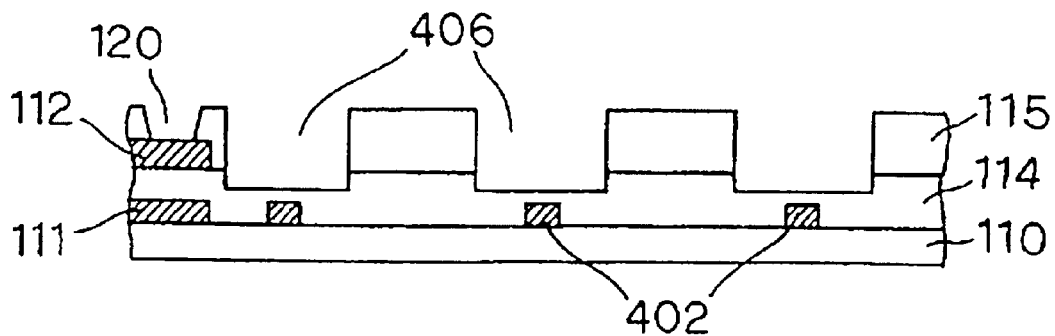

Then, second interlayer insulating film 115 is grown on the entire surface of first interlayer insulating film 114. As shown in FIG. 12B, contact hole 120 reaching second wiring pattern 112 is defined in second interlayer insulating film 115, and the interlayer insulating film at the positions of fuse electrodes 402 in fuse ROM 401 is removed while leaving a certain thickness thereof, thus defining recesses 406.

Figure 12C:
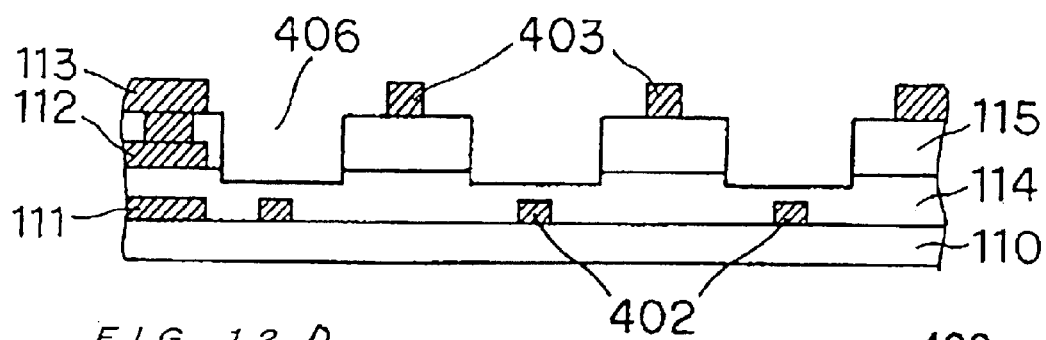

Then, as shown in FIG. 12C, third wiring pattern 113 connected to second wiring pattern 112 via contact hole 120 and fuse electrodes 403 in the upper layer in fuse ROM 401 are deposited as one aluminum layer on the surface of second interlayer insulating film 115.

Figure 12D:
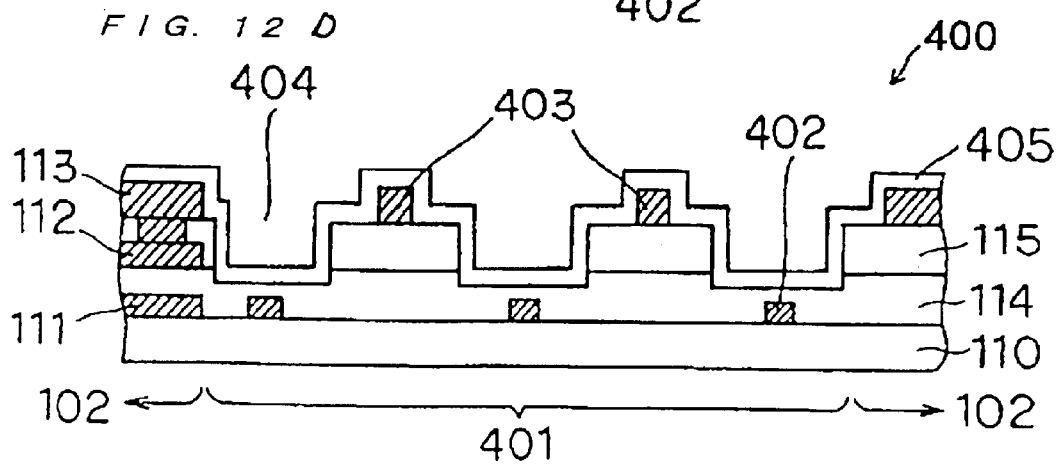
Figure 13:
FIGS. 13A through 13D are cross-sectional views showing successive steps of a method of cutting off a fuse electrode according to a modification of the third embodiment of the present invention.
Figure 13:
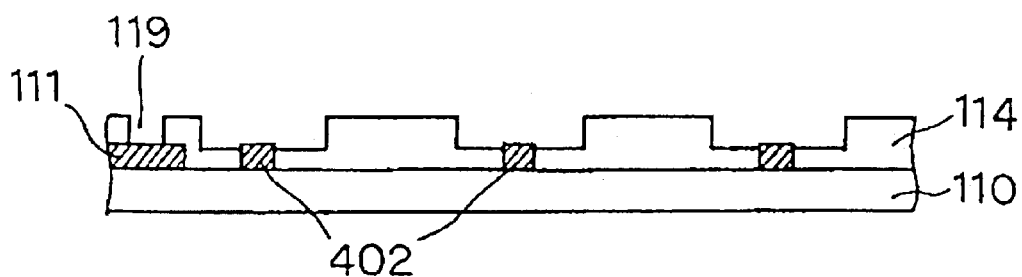
Figure 13:
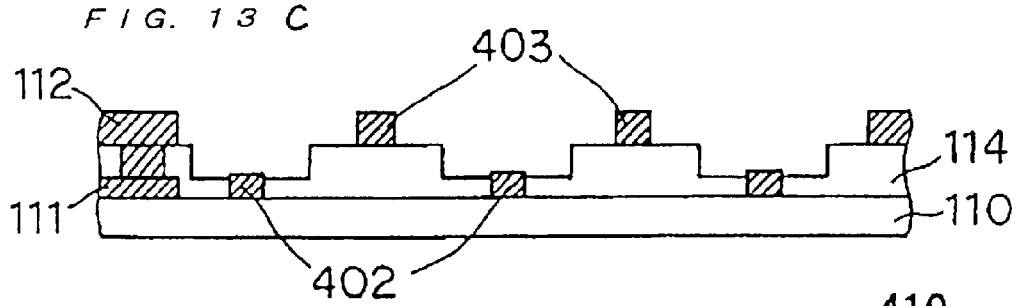
Figure 13:
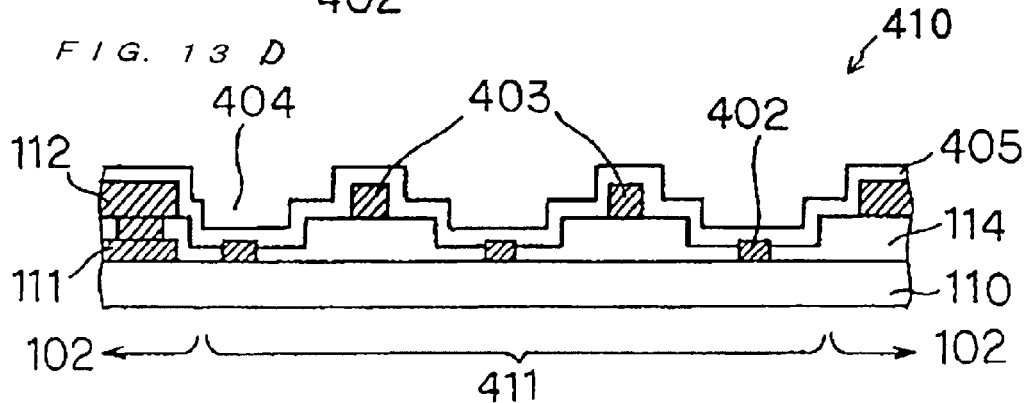

Then, as shown in FIG. 12D, a third cover layer 405 having a thickness of about 200 (nm) is grown on the entire surface of second interlayer insulating film 115. If desired, a passivation film and a polyimide film, not shown, are successively grown on the third cover layer 405. Contact hole 121 and recesses in the position of fuse ROM 401 are defined in the passivation film and the polyimide film.

In integrated circuit device 400, first wiring pattern 111 and fuse electrodes 402 in the lower layer, and third wiring pattern 113 and fuse electrodes 403 in the upper layer can be fabricated in one step, and contact holes 120, 121 and windows 404 can be defined in one step. Therefore, fuse ROM 401 and logic circuit 102 can be produced simultaneously with good productivity.

Particularly, because fuse electrodes 402, 403 in the two layers in fuse ROM 401 are produced in the same step as first wiring pattern 111 and third wiring pattern 113 of logic circuit 102. Thus, the positions of fuse electrodes 402, 403 can be vertically spaced sufficiently from each other. Since layers over fuse electrodes 402, 403 have a substantially uniform thickness, fuse electrodes 402, 403 can be cut off by a laser beam of constant intensity.

The above third embodiment is not limited to the details described above, but may be modified in various ways without departing from its scope. For example, in the illustrated embodiment, fuse electrodes 402, 403 in fuse ROM 401 are displaced alternately in the thickness direction depending on whether they are odd-numbered or even-numbered. However, fuse electrodes 402, 403 may be displaced into successive positions in the upper or lower layer or a certain number of fuse electrodes may be displaced together by turns in the upper layer and the lower layer.

In the illustrated embodiment, since it is assumed that recesses 406 to serve as windows 404 in fuse ROM 401 are defined together with contact hole 120 in logic circuit 102, first interlayer insulating film 114 remains on fuse electrodes 402 in the lower layer.

However, with first interlayer insulating film 114 remaining on fuse electrodes 402 in the lower layer, the insulating film over fuse electrodes 402, 403 in the two layers has slightly different thicknesses. It is possible to completely equalize the thicknesses of the layers over fuse electrodes 402, 403 in the two layers by etching first interlayer insulating film 114 in the positions of fuse electrodes 402 in the lower layer or etching third cover layer 405 in the positions of fuse electrodes 402 in the lower layer.

In the illustrated embodiment, fuse electrodes 402, 403 are produced in the same step as first wiring pattern 111 and third wiring pattern 113 of logic circuit 102. However, as with integrated circuit device 410 shown in FIGS. 13A–13D, fuse electrodes 402, 403 of fuse ROM 411 may be produced in the same step as first wiring pattern 111 and second wiring pattern 112 of logic circuit 102.

While preferred embodiments of the present invention have been described using specific terms, such description is for illustrative purposes only, and it is to be understood that changes and variations may be made without departing from the spirit or scope of the following claims.

What is claimed is:

1. An integrated circuit device comprising:
   a plurality of fuse electrodes disposed in a parallel array with a pitch less than a spot diameter of a laser beam to be used for cutting said fuse electrodes; and
   an insulating film covering said plurality of fuse electrodes,
   wherein said insulating film comprises:
      a plurality of cutting positions formed over said fuse electrodes in which said insulating film has a thickness which allows said laser beam to pass through said insulating film and cut said fuse electrodes;
   a plurality of regions of said insulating film having a thickness which prevents said laser beam from damaging said fuse electrodes, and
   wherein said plurality of cutting positions are disposed in respective positions which are different from each other in a direction in which said fuse electrodes extend; and
   wherein at least one of said plurality of fuse electrodes is disposed in a position in said insulating film that is different from a position of at least one other of said plurality of fuse electrodes, in a direction of a thickness of said insulating film.

2. The integrated circuit device of claim 1, wherein each successive fuse electrode of said plurality of fuse electrodes is disposed alternately in a position in said insulating film that is different from a position of a preceding fuse electrode of said plurality of fuse electrodes, in a direction of a thickness of said insulating film.

3. The integrated circuit device of claim 1, wherein at least one successive fuse electrode of said plurality of fuse electrodes is disposed in a position in a direction of a thickness of said insulating film that is the same as a position in a direction of a thickness of said insulating film of a preceding fuse electrode of said plurality of fuse electrodes.

* * * * *